United States Patent [19]

Crompton, III et al.

[11] Patent Number: 5,622,514
[45] Date of Patent: Apr. 22, 1997

[54] COVERLESS PIN GRID ARRAY SOCKET

[75] Inventors: James E. Crompton, III, Pfafftown; Randy A. Smith, Belews Creek, both of N.C.

[73] Assignee: The Whitaker Corporation, Wilmington, Del.

[21] Appl. No.: 497,271

[22] Filed: Jun. 30, 1995

[51] Int. Cl.⁶ .................................................. H01R 13/625
[52] U.S. Cl. ................................... 439/342; 439/337
[58] Field of Search ............................. 439/342, 346, 439/347, 348, 332, 337, 330, 68, 70

[56] References Cited

U.S. PATENT DOCUMENTS

| | | | |
|---|---|---|---|
| 3,869,185 | 3/1975 | Teagno | 439/342 |
| 4,080,032 | 3/1978 | Cherian et al. | 339/75 M |
| 4,245,877 | 1/1981 | Auriana | 339/74 R |
| 4,420,205 | 12/1983 | Kirkman | 339/74 R |
| 4,498,725 | 2/1985 | Bright et al. | 339/176 M |
| 4,531,792 | 7/1985 | Oshitani et al. | 339/17 CF |
| 4,538,871 | 9/1985 | Li | 439/342 |
| 4,988,310 | 1/1991 | Bright et al. | 439/342 |
| 5,155,905 | 10/1992 | Miller, Jr. | 29/843 |
| 5,256,080 | 10/1993 | Bright | 439/342 |

*Primary Examiner*—Hien Vu
*Attorney, Agent, or Firm*—Robert J. Kapalka

[57] ABSTRACT

An electrical socket (10) is disclosed for an electronic package (2) having an array of pins (4) wherein at least some of the pins are standoff pins each having a respective cross-sectional enlargement (6). The socket comprises a housing having a wall (12) defining a package mounting surface (14) and an oppositely facing locking surface (58). The wall has an array of openings (18, 48) which receive the pins and permit free passage of the enlargements through the wall. The openings include lateral channels (56) which are narrower than the enlargements. The package is secured to the socket by inserting the leads into their associated entranceways and moving the package transversely over the mounting surface so that the enlargements become trapped beneath the locking surface.

13 Claims, 4 Drawing Sheets

COVERLESS PIN GRID ARRAY SOCKET

FIELD OF THE INVENTION

The invention relates to a socket for a pin grid array electronic package wherein the socket has pin-receiving openings through a wall thereof and at least one of the openings is arranged to receive an enlargement of an associated pin and to capture the enlargement behind the wall when the package is moved across the socket.

BACKGROUND OF THE INVENTION

Sockets for removably mounting an electronic package on a circuit board or other substrate are well-known. An electronic package having terminal pins, or leads, is typically mounted on a socket having contacts with resilient arms which are deflected by the pins upon full insertion of the package, and the package is secured to the socket by frictional resistance of the contact arms acting on the pins.

A particular type of electronic package known as a pin grid array (PGA) package has terminal pins arranged in an array and extending away from a face of the package. Due to the relatively large number of pins associated with a PGA package, frictional resistance to insertion and extraction of the pins into and from a socket is generally quite large. In order to facilitate the socketing of PGA packages, zero insertion force (ZIF) PGA sockets have been developed examples of which are disclosed in U.S. Pat. Nos. 4,498,725 and 4,988,310 which are owned by AMP Incorporated of Harrisburg, Pa. These sockets have a base which houses an array of contacts, and a cover with a corresponding array of openings which is slidable on the base. When the cover is an open position relative to the base, the pins of the PGA package are insertable through the openings in the cover and into respective cavities in the base without encountering insertion resistance. When the cover is moved to a closed position, the pins are translated within their cavities so as to deflect arms of their associated contacts, thereby securing the package to the socket by frictional resistance. Movement of the cover back to the open position retracts the pins from engagement with the arms and thereby releases the package for removal.

The cover has two main purposes. One is to align the pins with the openings of their respective cavities so that the pins will enter clear portions of the cavities which are unobstructed by contacts. Another purpose is to provide a vehicle for translating the package across the top surface of the base so that the pins become engaged with their contacts. Although the cover serves these purposes, it also has drawbacks in that it increases the size, cost and complexity of the socket assembly. Further, the cover is generally actuated with a cam which is housed in a pocket between the base and the cover, and an actuation lever which is connected to the cam and exposed on a side of the socket. The cam and lever take up additional space and further increase the size and cost of the socket, and pose complexity in assembly of the socket. Due to the constant emphasis on miniaturization in modern technology, a ZIF socket which does not have a cover would be desirable.

ZIF sockets are also subject to accidental misuse by personnel that attempt to install a PGA package when the lever arm, and therefore the cover, is in the closed position. This problem has occurred even at manufacturer locations where proper training in procedures for installing PGA packages into ZIF sockets is supposedly provided. With the advent of a computer industry strategy which encourages end users to swap microprocessors in order to upgrade their machines, it is even more likely that PGA packages will be incorrectly applied to closed ZIF sockets. A ZIF socket which does not have a movable cover would overcome this problem.

SUMMARY OF THE INVENTION

The invention is a socket for an electronic package having an array of leads extending in a common direction from a face of the package, wherein at least some of the leads are standoff leads each having a respective cross-sectional enlargement at a predetermined distance from the face. The socket comprises a housing having a wall defining a package mounting surface and an oppositely facing locking surface. The locking surface is at a depth from the mounting surface which is less than the predetermined distance of the enlargements from the face. An array of openings corresponding to the array of leads extend through the wall. The openings provide access to a corresponding array of contacts in the housing. The openings include respective entranceways each dimensioned to permit free passage of an associated said lead to an interior of the housing, and respective channels extending laterally from the entranceways in respective directions selected to permit movement of the leads into mating engagement with the contacts when the package is moved along a selected path over the mounting surface. The entranceways of the openings which are associated with the standoff leads are dimensioned to permit passage of the enlargements to the interior, and the channels of the openings which are associated with the standoff leads are dimensioned narrower than the enlargements. The package may be secured to the socket by inserting the leads into their associated entranceways and moving the package transversely over the mounting surface until the leads are disposed in the channels and the enlargements are disposed beneath the locking surface.

BRIEF DESCRIPTION OF THE DRAWINGS

The invention will now be described by way of example with reference to the accompanying drawings in which like elements in different figures thereof are identified by the same reference numeral and wherein.

DETAILED DESCRIPTION OF THE PREFERRED EMBODIMENT

Figure 1:
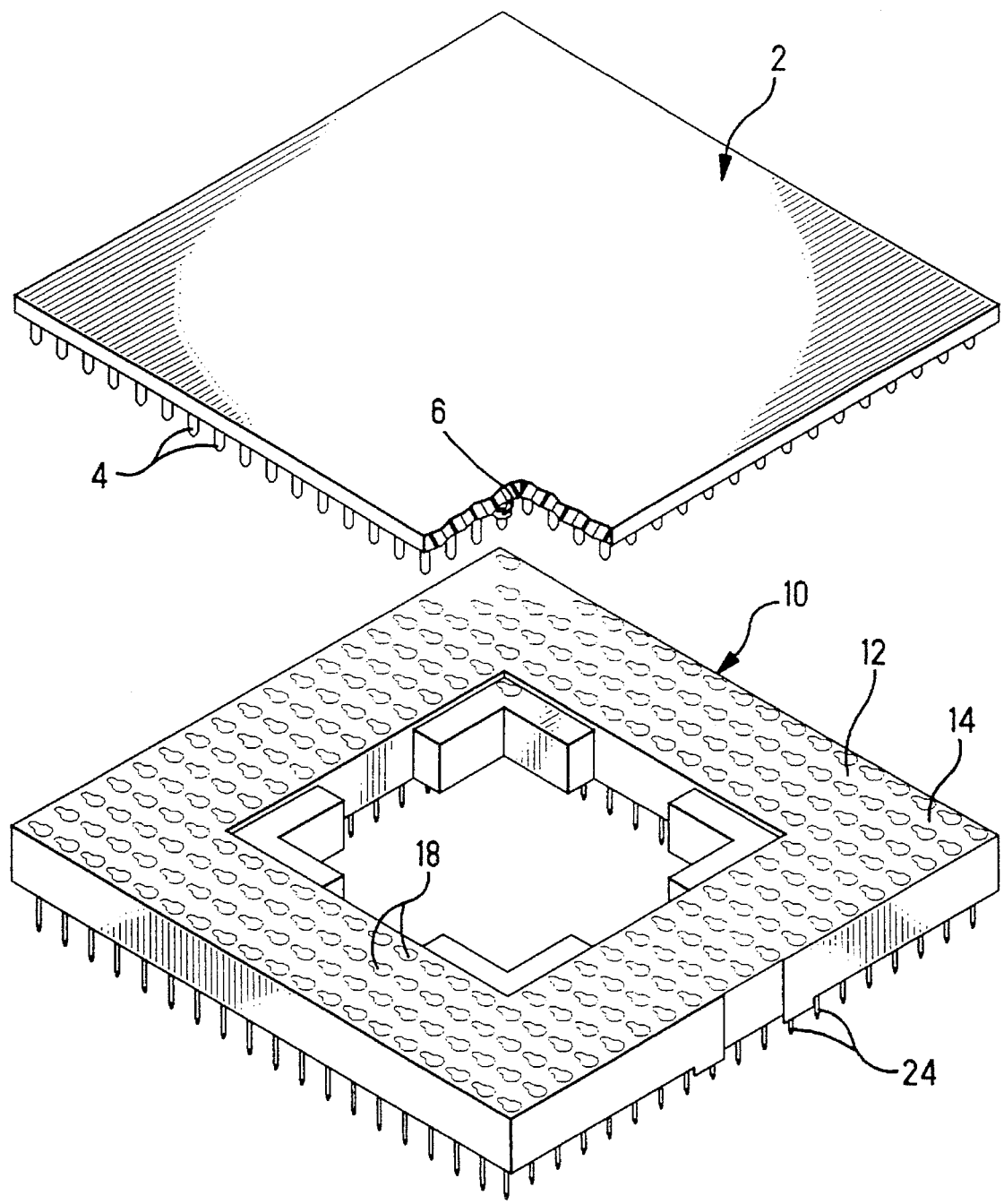
FIG. 1 is an isometric view of a socket according to the invention and an electronic package which can be mounted thereon.
Figure 2:
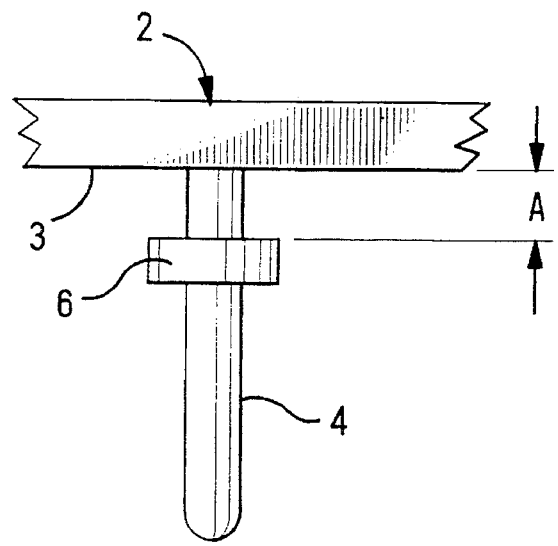
FIG. 2 is a side elevation view of an electronic package pin having a standoff.

There is shown in FIG. 1 a socket 10 according to the invention which is useful for removably mounting an electronic package 2 on a circuit board or other substrate (not shown). The package 2 houses a microprocessor and has an array of terminal pins, or leads, 4 extending in a common direction downwardly from a bottom face thereof. Such packages 2 are well known as pin grid array (PGA) packages and are produced in a variety of standard configurations which differ in, for example, pin count, grid arrangement, and pin spacing. Many of these standard packages are produced with an industry accepted standoff feature wherein several of the pins 4 each have a standoff 6 which is an enlarged cross-sectional portion of the pin at a predetermined distance A from a bottom face 3 of the package, as seen in FIG. 2. The standoffs 6 serve to elevate the package 2 slightly above the surface of a circuit board when the package 2 is mounted directly on the circuit board with the pins 4 soldered in respective through-holes of the board, thereby providing clearance for cleanout of the soldered connections and allowing visual inspection of the connections. Typically, the standoffs 6 are provided on four of the pins 4, one near each of the corners of the package 2. The socket 10 of the present invention is adapted to receive a package 2 having the industry accepted standoff feature wherein at least some of the pins 4 have the standoffs 6.

Figure 3:
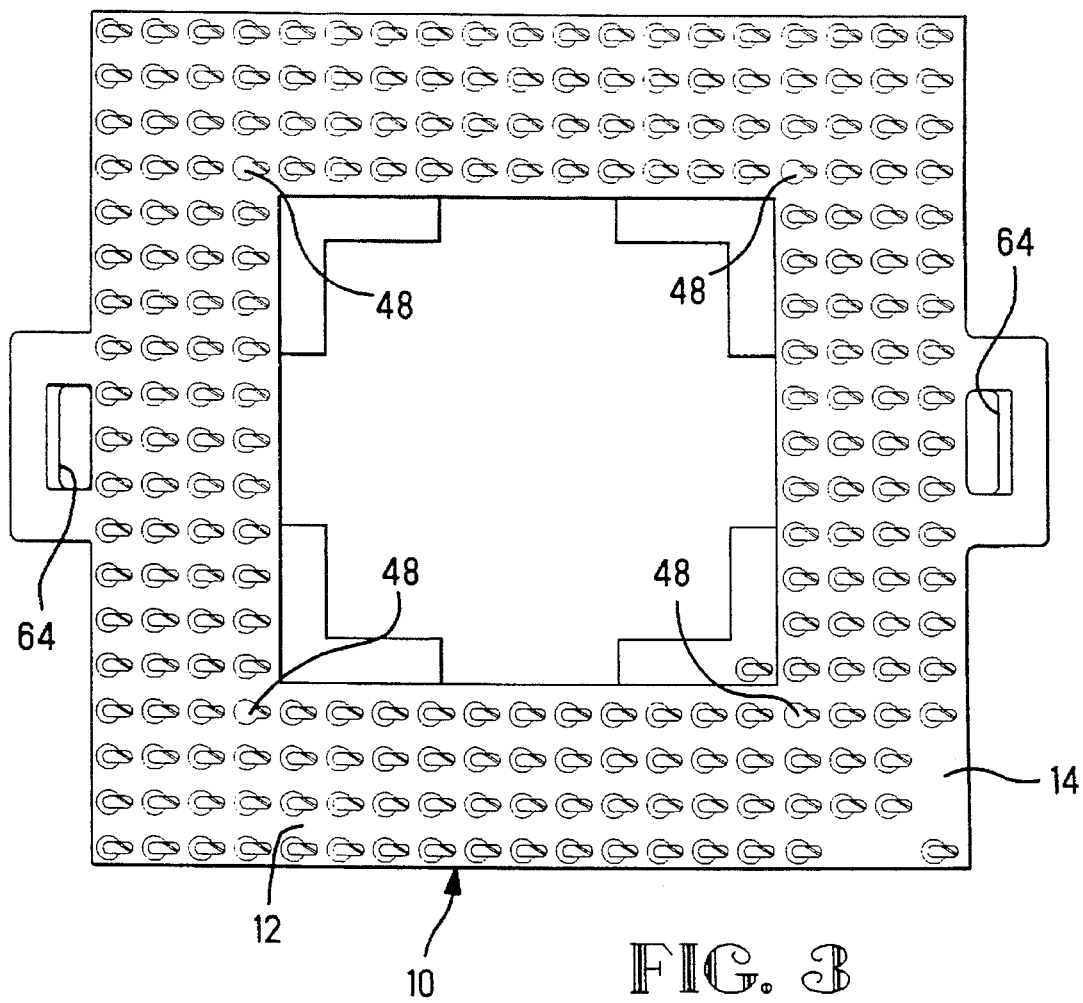
FIG. 3 a top plan view of the socket according to the invention.

With reference to FIGS. 1 and 3, the socket 10 comprises a housing having a top wall 12 which defines a package mounting surface 14. An array of openings 18 in the wall 12 which correspond to the array of pins 4 of the package provide access to a corresponding array of contacts 20 in an interior of the housing. At least some of the openings 18 are standoff openings 48 which are specially adapted to cooperate with those of the pins 4 having the standoffs 6 in such a manner that the standoffs 6 are locked beneath the top wall 12 of the housing as will be more fully described hereinafter. In the illustrated example there are four standoff openings 48.

Figure 4:
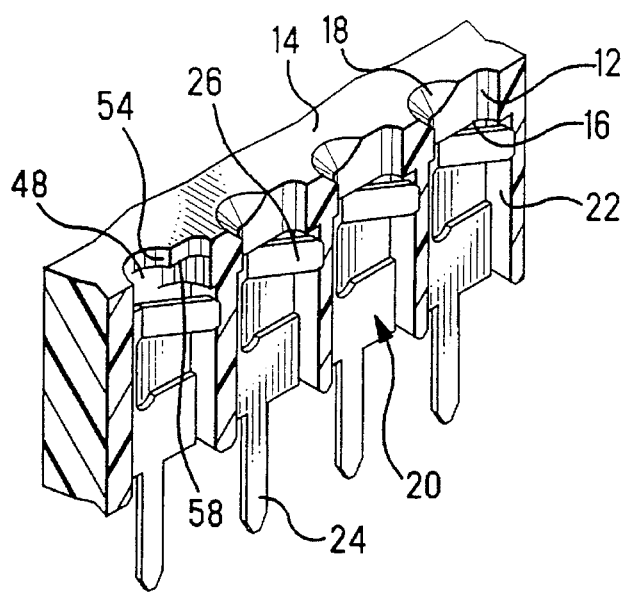
FIGS. 4 and 5 are isometric cross-sectional views through a portion of the socket.
Figure 5:
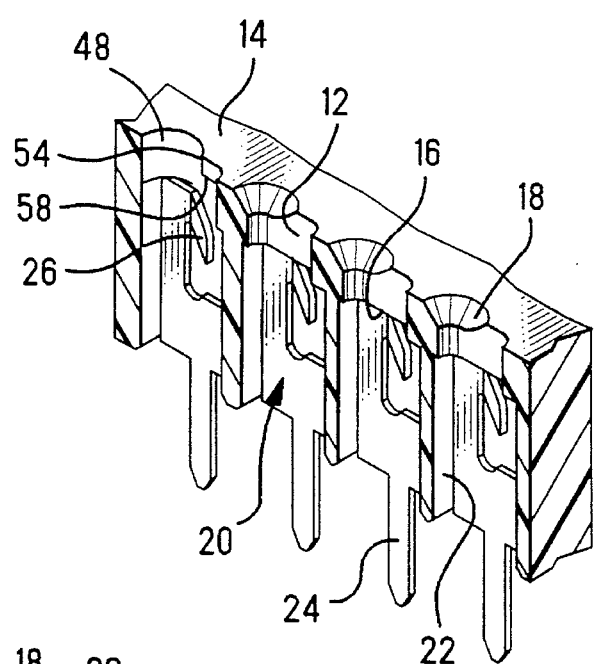

As shown in cross-section in FIGS. 4 and 5, the contacts 20 reside in cavities 22 below an under surface 16 of the top wall 12. Each of the contacts 20 is a metallic body which is stamped and formed from sheet material and is inserted into the socket 10 through an opening in the bottom thereof. Each of the contacts 20 has a depending lead 24 which is insertable in a through-hole of a circuit board substrate, and a cantilever contact arm 26 which is arranged for engagement and deflection by a corresponding one of the pins 4 when the package 2 is assembled on the socket.

Figure 6:
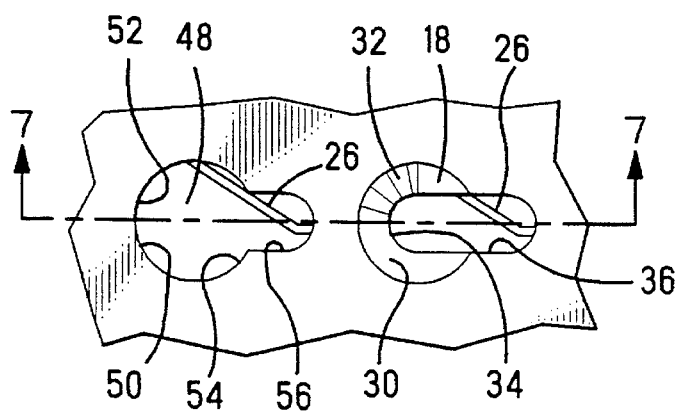
FIG. 6 is an enlarged top plan view of cavities in the socket.
Figure 7:
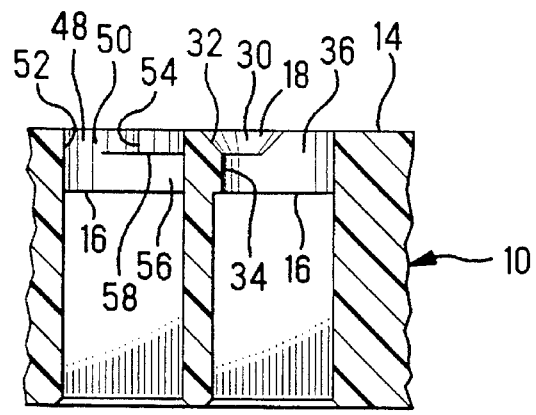
FIG. 7 is a cross-sectional view taken along line 7—7 of FIG. 6.
Figure 8:
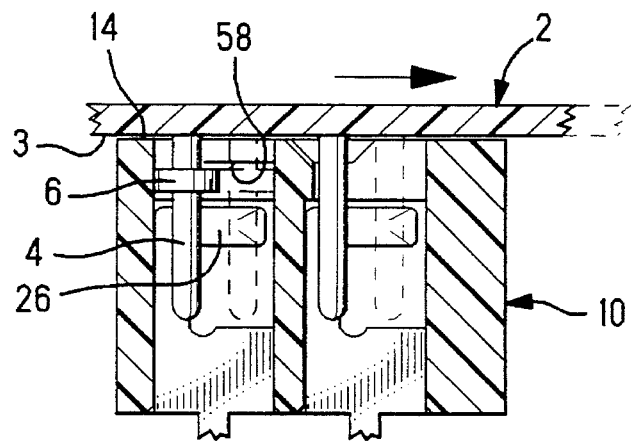
FIG. 8 is a cross-sectional view similar to FIG. 7 showing an electronic package mounted on the socket.

Referring to FIGS. 6–8, each of the openings 18, 48 includes an entranceway 30, 50 which is dimensioned to permit free passage of an associated pin 4 into the housing. The entranceway 30 includes a frusto-conical wall surface 32 and a cylindrical wall surface 34. wall surface 32 converges axially inwardly as it descends from the top surface 12 toward the cavity 22, thereby acting as an alignment funnel so as to guide an associated pin 4 into an unobstructed portion of the cavity 22 where there is no interfering portion of the contact 20. The wall surface 34 has a bore dimension which is somewhat greater than a diameter of the pin 4 so as to provide clearance for the pin 4 while allowing for positional tolerances on the pin 4 and the entranceway 30, but the wall surface 34 otherwise provides stability and alignment for the pin which is inserted therein.

The entranceway 50 has a cylindrical bore defined by wall surface 52. The bore of the entranceway 50 is dimensioned to permit passage of the standoff 6 therethrough. An undercut in the wall 12 defines an undercut surface 58 which extends from a truncated surface 54 of the wall surface 52, as seen in FIGS. 4, 5 and 7. The undercut surface 58 is vertically below the mounting surface 14 at a distance which is selected so that the vertical dimension of the truncated surface 54 is less than the dimension A, shown in FIG. 2, from the face 3 of the package to the standoff 6. Therefore, when the package 2 is introduced onto the socket 10 by inserting the pins 4 into their respective openings 18, 48 until the package engages the mounting surface 14, each of the standoffs 6 will reside relatively below its respective undercut surface 58, as shown by solid lines in FIG. 8.

Each of the openings 18, 48 further includes a channel 36, 56 which extends laterally from the entranceway 30, 50 in a direction which permits translational movement of the package 2 over the mounting surface 14. During translational movement of the package, the pins 4 are moved from the inserted position which is shown by solid lines in FIG. 8 to an actuated position which is shown by phantom lines, wherein the pins 4 are moved into mating engagement with their associated contacts 20. Concurrently, each of the standoffs 6 is moved to a position beneath its associated undercut surface 58. The surface 58 thus functions as a locking surface which prevents vertical withdrawal of the standoff and provides a positive lock of the package in the socket. As can be seen, the standoff 6 is at all times disposed above the contact 20 and does not engage or interfere with the contact arm 26.

Instead of an undercut in the wall 12, the under surface 16 of the wall could function as a locking surface for the standoff if the thickness of the wall 12 was selected to be less than the dimension A.

In the illustrated example the channels 36, 56 all extend in a common direction linearly from their respective entranceways, thereby enabling the package 2 to be translated linearly on the socket. However, the channels could be made to extend arcuately about a common axis if the contacts 20 were appropriately aligned with the axis, and thus the package 2 would be translated on the socket with a pivoting or rotating motion.

Figure 9:
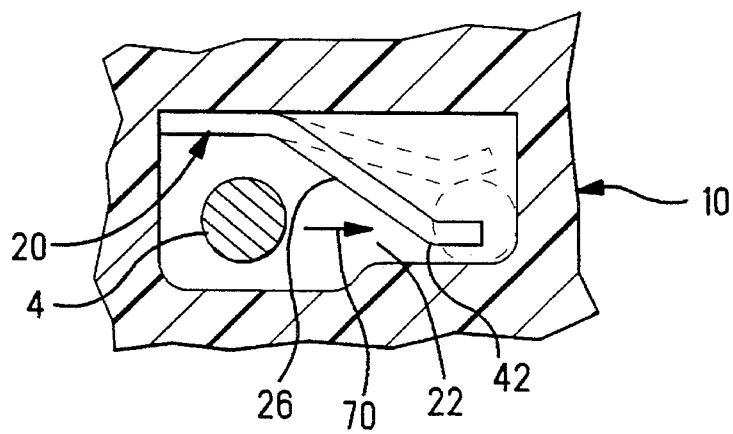
FIG. 9 is a top cross-sectional view through a single cavity in the socket.

Referring now to FIG. 9, each of the contact arms 26 includes a bend portion 42 which is arranged to provide an overcenter bias on the pin 4. As the pin is moved in the actuation direction shown by arrow 70, it engages and deflects the contact arm 26. Meanwhile, the arm exerts a reaction force on the pin which is a combination of deflection force and friction force, and these resist movement of the pin in the actuation direction. When the pin 4 reaches a centered position with respect to the bend portion 42, the arm 26 is in a state of maximum deflection so that the pin experiences only friction force which resists movement of the pin in either direction. As the pin moves beyond the centered position to the overcenter or actuation position shown by phantom lines, the reaction force of the arm on the pin becomes directed so as to urge the pin further in the actuation direction and to resist pullback of the pin to the inserted position. Thus, the bend portion 42 provides an overcenter biasing mechanism such that when the pin is in the actuated position, the arm 26 urges the pin to remain in the actuated position.

In order to facilitate transfer of the package 2 between the inserted and the actuated positions, the socket housing may have one or a pair of cutouts 64, as shown in FIG. 3. The cutouts 64 are engageable with a prying tool, such as a screwdriver, which can be used as a lever to exert a force on the package 2 for translating the package over the mounting surface.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical socket for an electronic package having an array of pins extending in a common direction from a bottom face of said package, at least some of said pins each having a respective cross-sectional enlargement extending outwardly therefrom at a respective predetermined distance from said bottom face, the socket comprising:

a housing having a wall defining a package mounting surface, an array of openings in the wall corresponding to the array of pins, said openings providing access to a corresponding array of electrical contacts in the housing, said openings including respective entranceways each dimensioned to permit free passage of an associated said pin to an interior of the housing, and respective channels extending laterally from said entranceways in respective directions selected to permit movement of said pins into electrical mating engagement with said contacts when said package is moved along a selected path over said mounting surface;

wherein said entranceways of said openings which are associated with said at least some pins are dimensioned to permit passage of said enlargements into said interior, and said channels of said openings which are associated with said at least some pins are dimensioned narrower than their respective said enlargements, each of said narrower channels extending for a respective depth dimension from said mounting surface to a respective oppositely facing locking surface, each said depth dimension being less than said predetermined distance of an associated said pin such that said enlargements are trapped beneath said locking surfaces when said pins are disposed in said channels; and wherein said package is secured to said socket by inserting said pins into said entranceways and moving said package transversely over said mounting surface until said pins are electrically engage with said contacts and said enlargements are disposed beneath said locking surfaces.

2. The electrical socket according to claim 1, wherein said channels extend in a common direction from said entranceways.

3. The electrical socket according to claim 1, wherein said locking surfaces are defined by undercuts in said wall adjacent to said channels.

4. The electrical socket according to claim 1, wherein some said entranceways of said openings which are not associated with said at least some pins each have a wall surface which converges axially inwardly as said entranceway extends from said mounting surface.

5. The electrical socket according to claim 1, wherein each of said contacts has a cantilever arm which is arranged to be deflected by an associated said pin when said pin is moved into a corresponding said channel.

6. The electrical socket according to claim 5, wherein said cantilever arm includes a bend portion which is arranged to provide an overcenter bias on said pin such that when said pin is moved in said channel to an overcenter position wherein said cantilever arm is deflected and said pin is beyond said bend portion, said pin is biased by said cantilever arm to remain in said overcenter position.

7. The electrical socket according to claim 1, wherein said housing includes a cutout which is engageable by a prying tool to permit a force to be exerted on said package for translating said package over said mounting surface.

8. An electrical socket for an electronic package having an array of pins extending in a common direction from a face of said package, at least some of said pins each having a respective cross-sectional enlargement extending outwardly therefrom at a predetermined distance from said bottom face, the socket comprising:

a housing having a wall defining a package mounting surface and an oppositely facing locking surface, said wall having a thickness dimension between said mounting surface and said locking surface, said thickness dimension being less than the predetermined distance, an array of openings extending through the wall and corresponding to the array of pins, said openings providing access to a corresponding array of electrical contacts in the housing, said openings including respective entranceways each dimensioned to permit free passage of an associated said pin to an interior of the housing, and respective channels extending laterally from said entranceways in respective directions selected to permit movement of said pins into electrical mating engagement with said contacts when said package is moved along a selected path over said mounting surface;

wherein said entranceways of said openings which are associated with said at least some pins are dimensioned to permit passage of said enlargements through said wall, and said channels of said openings which are associated with said at least some pins are dimensioned narrower than said enlargements; and wherein said package is secured to said socket by inserting said pins into said entranceways and moving said package transversely over said mounting surface until said pins are electrically engaged with said contacts and said enlargements are disposed beneath said locking surface.

9. The electrical socket according to claim 8, wherein said channels extend in a common direction from said entranceways.

10. The electrical socket according to claim 8, wherein some of said entranceways of said openings which are not associated with said at least some pins each have a wall surface which converges axially inwardly as said entranceway extends from said mounting surface.

11. The electrical socket according to claim 8, wherein each of said contacts has a cantilever arm which is arranged to be deflected by an associated said pin when said pin is moved into a corresponding said channel.

12. The electrical socket according to claim 11, wherein said cantilever arm includes a bend portion which is arranged to provide an overcenter bias on said pin such that when said pin is moved in said channel to an overcenter position wherein said cantilever arm is deflected and said pin is beyond said bend portion, said pin is biased by said cantilever arm to remain in said overcenter position.

13. The electrical socket according to claim 8, wherein said housing includes a cutout which is engageable by a prying tool to permit a force to be exerted on said package for translating said package over said mounting surface.

* * * * *